United States Patent
Urata et al.

(10) Patent No.: US 7,484,154 B2
(45) Date of Patent: Jan. 27, 2009

(54) SEMICONDUCTOR INTEGRATED CIRCUIT, METHOD FOR TESTING SEMICONDUCTOR INTEGRATED CIRCUIT, AND COMPUTER READABLE MEDIUM FOR THE SAME

(75) Inventors: Koji Urata, Saitama (JP); Yasutomo Onozaki, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 379 days.

(21) Appl. No.: 11/480,958

(22) Filed: Jul. 6, 2006

(65) Prior Publication Data
US 2007/0022343 A1 Jan. 25, 2007

(30) Foreign Application Priority Data
Jul. 6, 2005 (JP) .............................. 2005-197888

(51) Int. Cl.
*G01R 31/28* (2006.01)
(52) U.S. Cl. ........................ 714/733; 714/718; 714/729
(58) Field of Classification Search ................. 714/726, 714/48, 30, 719, 733, 718; 716/4
See application file for complete search history.

(56) References Cited

U.S. PATENT DOCUMENTS

| | | | |
|---|---|---|---|
| 6,148,425 A * | 11/2000 | Bhawmik et al. ........... 714/726 |
| 6,205,564 B1 * | 3/2001 | Kim et al. ...................... 714/48 |
| 6,668,347 B1 * | 12/2003 | Babella et al. ............... 714/733 |
| 6,687,865 B1 * | 2/2004 | Dervisoglu et al. .......... 714/726 |
| 7,131,081 B2 * | 10/2006 | Wang et al. ...................... 716/4 |
| 7,168,004 B2 * | 1/2007 | Sugimura et al. ............. 714/30 |
| 2006/0041807 A1 * | 2/2006 | Terai ........................... 714/733 |

FOREIGN PATENT DOCUMENTS

JP 2004-334933 11/2004

* cited by examiner

*Primary Examiner*—David Ton
(74) *Attorney, Agent, or Firm*—Banner & Witcoff, Ltd.

(57) ABSTRACT

A semiconductor integrated circuit includes a random access memory; a memory BIST circuit that writes a memory test pattern into the random access memory after the random access memory passes a failure test; a scan chain which effects shift-in of a logic test pattern generated by automatic pattern generation on condition that the memory test pattern is read without being rewritten; and a combinational logic circuit that can configure a system logic circuit along with the scan chain. The random access memory outputs a data signal read from the memory test pattern, by a read command signal that is attributable to the logic test pattern and is passed the combinational logic circuit. The test result that is attributed to the read data signal and is passed through the combinational logic circuit is input to the scan chain. The scan chain shifts out the test result.

5 Claims, 12 Drawing Sheets

21, 22, 24: SELECTOR LOGIC CIRCUITS

FIG. 12

| MODE | BIST_EN_1 | BIST_EN_2 |
|---|---|---|
| TEST1 | 0 | 1 |
| TEST2 | 1 | 0 |

| MODE | BIST_EN_1 | BIST_EN_2 | ······ | BIST_EN_n |
|---|---|---|---|---|
| TEST1 | 0 | 1 | 1 | 1 |
| TEST2 | 1 | 0 | 1 | 1 |
| ⋮ | 1 | 1 |  | 1 |
| TESTn | 1 | 1 | 1 | 0 |

SEMICONDUCTOR INTEGRATED CIRCUIT, METHOD FOR TESTING SEMICONDUCTOR INTEGRATED CIRCUIT, AND COMPUTER READABLE MEDIUM FOR THE SAME

CROSS-REFERENCE TO RELATED APPLICATION

This application is based on and claims the benefit of priority from the prior Japanese Patent Application No. 2005-197888, filed on Jul. 6, 2005; the entire contents of which are incorporated herein by reference.

TECHNICAL FIELD

The present invention relates to a semiconductor integrated circuit equipped with random access memory (RAM) and a system logic circuit, a method for testing the same, and computer readable medium for testing the same.

BACKGROUND

When the system logic circuit is tested incorporated into the semiconductor integrated circuit by a scan design formed from a scan chain, a bypass logic circuit is additionally provided around RAM incorporated in the semiconductor integrated circuit. During the test of the system logic circuit, a signal is arranged so as to bypass the RAM. Thereby, an improvement in the fault coverage in the system logic circuit and a decrease in the number of test patterns can be realized. In general, RAM is additionally provided with a custom-designed built-in self-test (hereinafter, referred to as "BIST") circuit having built-in memory, and is tested independently of the system logic circuit. However, in an at-speed test for testing AC failures, a test configuration, which causes a signal to bypass RAM during the test of the system logic circuit, poses a problem.

An AC scan test; e.g., a transition test or a path test, is used for the at-speed test of the system logic circuit. Further, an at-speed memory BIST test performed by a memory BIST circuit is applied to the at-speed test of RAM. However, the at-speed test of a memory peripheral logic circuit cannot be conducted by the AC scan test or the at-speed memory BIST test. It is originally hard for the bypass logic circuit, which has been additionally provided for testing the system logic circuit, to perform at-speed operation. The bypass logic circuit is handled as a timing false path. Since the timing false Path is excluded from an object of test during generation of a AC scan test pattern. Hence, the at-speed test of a peripheral logic section of RAM cannot be performed.

A method for conducting the at-speed test of the peripheral logic section of RAM is to use an original path, which accesses RAM without passing through the bypass logic circuit, is used at the time of generation of a test pattern for an AC scan test in the system logic circuit (see, e.g., JP-A-2004-334933). At this time, an automatic test pattern generation (ATPG: Automatic Test Pattern Generation) tool, which generates a test pattern in a system logic circuit, must be able to generate a test pattern by comprehending operation of RAM. However, an ATPG tool using a memory operation model is different from a combinational ATPG tool for use with a simple combinational logic circuit, and must use a sequential algorithm which enables handling of a sequential circuit. An ATPG tool having a sequential algorithm using a memory operation model is longer in execution time than the combinational ATPG tool. The number of generated test patterns becomes very long. The reason for this is that logic, which is a combination of memory peripheral logic and a memory operation model, becomes very complicated.

SUMMARY

According to an aspect of the present invention, there is provided a semiconductor integrated circuit comprising:

random access memory;

a memory BIST circuit for writing a memory test patter into the random access memory after the random access memory has-passed a failure test;

a scan chain which effects shift-in of a logic test pattern generated by automatic pattern generation on condition that the memory test pattern is read without being rewritten; and a combinational logic circuit which can constitute a system logic circuit along with the scan chain, wherein the random access memory outputs a data signal read from the memory test pattern, by a read command signal which is attributable to the logic test pattern and has passed the combinational logic circuit; a test result which is attributed to the read data signal and has passed through the combinational logic circuit is input to the scan chain; and the scan chain shifts out the test result.

According to another aspect of the present invention, there is provided a method for testing a semiconductor integrated circuit, comprising:

generating a logic test pattern by automatic pattern generation on condition that a memory test pattern written in random access memory is read without being rewritten;

a memory BIST circuit performing a failure test of the random access memory;

the memory BIST circuit writing the memory test pattern into the random access memory after the random access memory has passed the failure test;

a scan chain, which can constitute a system logic circuit along with a combinational logic circuit, shifting-in the logic test pattern;

the random access memory outputting a read data signal read from the memory test pattern in accordance with a read command signal which is attributed to the logic test pattern and has passed through the combinational logic circuit;

inputting a test result, which is attributed to the read data signal and has passed through the combinational logic circuit, into the scan chain; and the scan chain shifting out the test result.

According to another aspect of the present invention, there is provided a method for testing a semiconductor integrated circuit, comprising:

a memory BIST circuit, which is connected to a plurality of input terminals of random access memory, performing a failure test of the random access memory;

generating a logic test pattern by automatic pattern generation on condition that some of the input terminals are connected to the memory BIST circuit and that the other input terminals are connected to a system logic circuit;

writing a test pattern into the random access memory by use of a scan chain in the memory BIST circuit after the random access memory has passed the failure test;

a scan chain, which can constitute a system logic circuit along with a combinational logic circuit, shifting in the logic test pattern;

the random access memory outputting a read data signal read from the memory test pattern, in accordance with a read command signal which is attributed to the logic test pattern and has been read through the combinational logic circuit;

inputting a test result, which is attributed to the read data signal and has passed through the combinational logic circuit, into the scan chain; and the scan chain shifting in the test result.

BRIEF DESCRIPTION OF THE DRAWINGS

These and other objects and advantages of this invention will become more fully apparent from the following detailed description taken with the accompanying drawings in which.

DESCRIPTION OF THE EMBODIMENTS

Embodiments of the present invention will now be described by reference to the drawings. The embodiments are described herein be low by reference to the drawings. However, the drawings are intended solely for providing illustrative comprehension, and the present invention is not limited to these drawings. In the descriptions of the drawings provided below, like or identical elements are assigned like or identical reference numerals. It is noted that the drawings are diagrammatic and differ from realities.

First Embodiment

Figure 1:
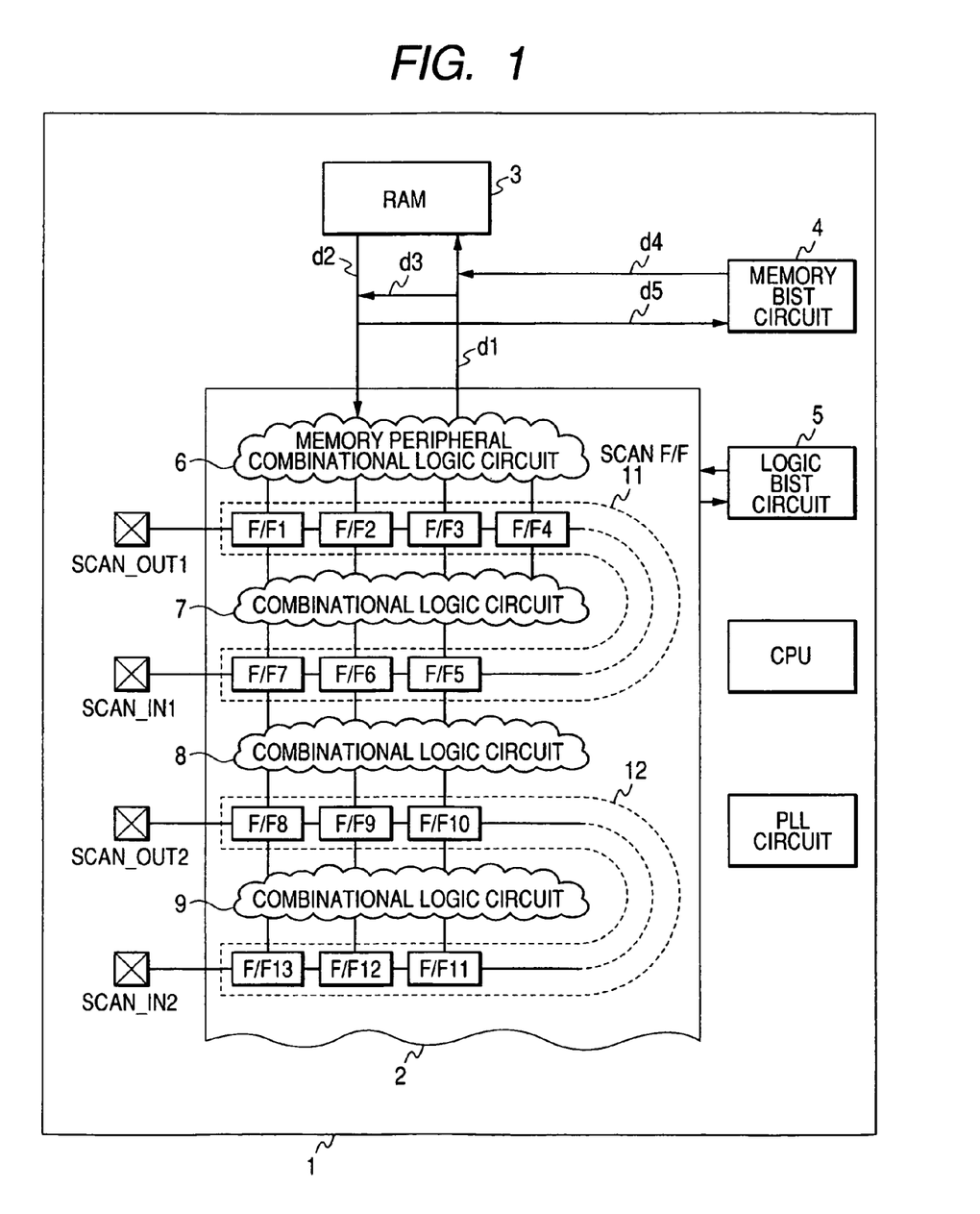
FIG. 1 is a block diagram (part 1) of a semiconductor integrated circuit according to an embodiment of the present invention.

As shown in FIG. 1, a semiconductor integrated circuit 1 according to a first embodiment comprises a system logic circuit 2, random access memory (RAM) 3, a memory BIST circuit 4, a logic BIST circuit 5, a central processing unit CPU, and a phased-lock loop (PLL) circuit. The memory BIST circuit 4 can carry out a failure test of the RAM 3 at an at-speed. The logic BIST circuit 5 can perform a failure test of the system logic circuit 2 at a at-speed in a logic BIST mode. In an ordinary operation mode, the system logic circuit 2 operates by a previously-designed function. In a scan test mode, the system logic circuit 2 operates as a memory peripheral combinational logic circuit 6, combinational logic circuits 7 through 9, and scan chains (F/F) 11, 12.

The scan chain 11 has flip-flips F/F1 to F/F7 which are connected in the form of a chain. The flip-flop F/F1 is connected to a pad SCAN OUT1, and the flip-flop F/F7 is connected to a pad SCAN IN1. The scan chain 12 has flip-flops 8 to 13 which are connected in the form of a chain. The flip-flop F/F8 is connected to a pad SCAN OUT2, and the flip-flop F/F13 is connected to a pad SCN IN2.

In a scan test mode, a scan test pattern is scanned into the scan chain 2 from the pad SCAN IN2, as well as being scanned into the scan chain 1 from the pad SCAN IN1. The test patterns are stored in the flip-flops F/F1 through F/F13. The flip-flops F/F1 through F/F13 output the stored test patterns to the memory peripheral combinational logic circuit 6 and the combinational logic circuits 7 through 9. Specifically, the flip-flops F/F11 through F/F13 output the test patterns to the combinational logic circuit 9. Test results output from the combinational logic circuit 9 are input and stored in the flip-flops F/F8 through F/F10. Likewise, the flip-flops F/F8 through F/F10 output the test patterns to the combinational logic circuit 8. Test results output from the combinational logic circuit 8 are input and stored into the flip-flops F/F5 through F/F7. The flip-flops F/F5 through F/F7 output test patterns to the combinational logic circuit 7. Test results output from the combinational logic circuit 7 are input and stored into the flip-flops F/F1 through F/F4. Finally, the flip-flops F/F1 through F/F4 output test patterns to the memory peripheral combinational logic circuit 6. The memory peripheral combinational logic circuit 6 is connected to RAM. In accordance with the input test pattern, the memory peripheral combinational logic circuit 6 outputs a read command signal d1 to the RAM 3. In accordance with the read command signal d1, the RAM 3 outputs a previously-stored read data signal d2, which will be described later. The memory peripheral combinational logic circuit 6 inputs test results arising from the read data signal d2 to the flip-flops F/F1 through F/F4, where the test results are stored. Finally, the scan chains 11, 12 formed from the flip-flops F/F1 through F/F13 effect shifting-out of the test results from the pad SCAN OUT 1 and the pad SCAN OUT 2.

Surroundings of the RAM 3 in the semiconductor integrated circuit 1 will be described in more detail by reference to FIG. 2. A logic clock (CLK) line and a scan enable SCAN EN1 are connected to the respective flip-flops F/F1 through F/F4 of the scan chain 11. The flip-flops F/F1 through F/F4 are connected to the memory peripheral combinational logic circuit 6, and the memory peripheral combinational logic circuit 6 is connected to input terminals of selector logic circuits 21, 22.

The memory BIST circuit 4 has a scan chain 14 and an AND circuit AND1. The memory BIST circuit 4 generates a write finish signal Write Finish after having written data for one operation into the RAM 3. The write finish signal Write Finish and a memory BIST clock signal mBIST CLK are input to the input terminal of the AND circuit AND1. An output terminal of the AND circuit AND1 is connected to an input terminal of the selector logic circuit 23. As a result, only when the write finish signal Write Finish is high; namely, only in the course of data for one operation being written into the RAM 3, the memory BIST clock signal mBIST CLK can be output to the AND circuit AND1.

The other input terminal of the selector logic circuit 23 is connected to a logic CLK circuit through the memory peripheral combinational logic circuit 6. An output terminal of the selector logic circuit 23 is connected to the memory CLK circuit of the RAM 3. According to the BIST enable signal BIST EN, the selector logic circuit 23 can select, as a memory CLK signal, either the logic CLK signal or the memory BIST clock signal mBIST CLK.

The scan chain 14 has the flip-flops F/F14 and F/F15 which are connected in the form of a chain. The memory BIST clock signal mBIST CLK and the scan enable signal SCAN EN2 are connected to the flip-flops F/F14 and F/F15 of the scan chain 14. The flip-flop F/F14 and F/F15 are connected to the input terminals of the selector logic circuits 21 and 22. Output terminals of the selector logic circuits 21 and 22 are connected to the RAM 3. In accordance with the BIST enable signal BIST EN, the selector logic circuits 21 and 22 can select whether the input terminal of the RAM 3 is connected to the memory peripheral combinational logic circuit 6 or to the memory BIST circuit 4.

The output terminal of the RAM 3 is connected to the memory BIST circuit 4. As mentioned above, the BIST circuit 4 enables the RAM 3 to effect BIST. At the time of BIST of the RAM 3, one of terminals of the selector logic circuits 21, 22, and 23 to be connected to the memory BIST circuit 4 is selected.

The output terminal of the RAM 3 is connected to input terminals of the selector logic circuits 24 and 25. Further, the other input terminals of the selector logic circuits 24 and 25 are connected to output terminals of the selector logic circuits 21 and 22. As mentioned above, a test can be conducted at a frequency for a low test configuration where a signal bypasses RAM during the course of a test of the memory peripheral combinational logic circuit 6. In the case of such a test for bypassing RAM, the selector logic circuits 24, 25 select terminals connected to a path d3, which bypasses the RAM 3, in accordance with a bypass enable Bypass EN. By a test which bypasses RAM, a stuck-at fault in the memory peripheral combinational logic circuit 6 can be detected.

Output terminals of the selector logic circuits 24 and 24 are connected to the memory peripheral combinational logic circuit 6. The memory peripheral combinational logic circuit 6 is connected to the flip-flops F/F1 and F/F2 of the scan chain 11.

Figure 3:
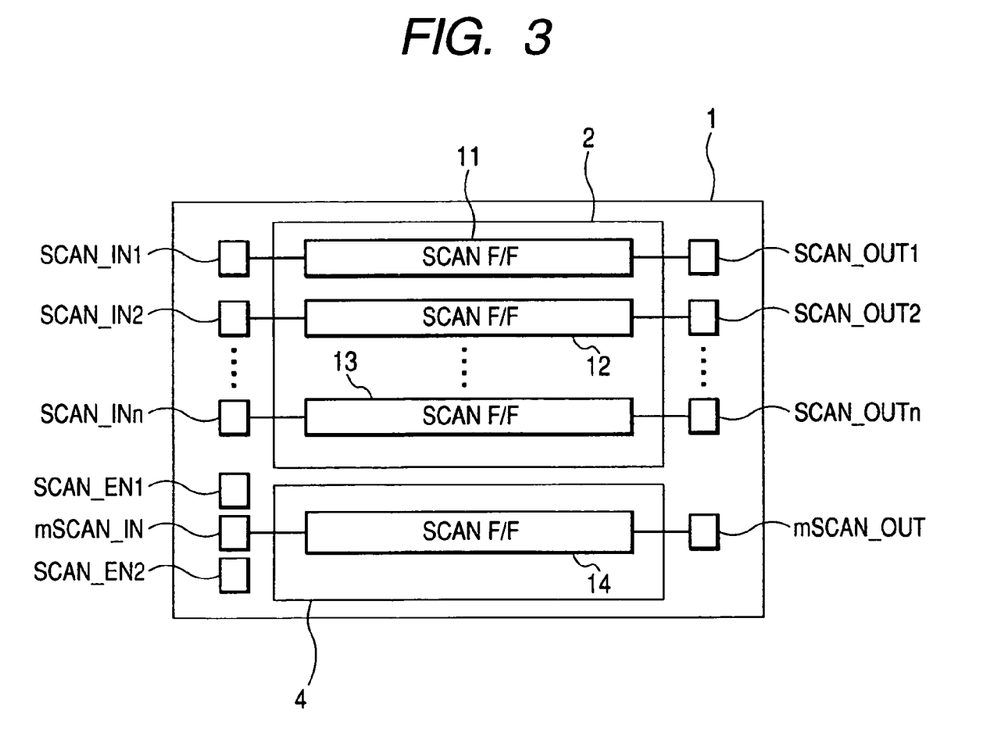
FIG. 3 is a block diagram (part 3) of a semiconductor integrated circuit according to the embodiment.

As shown in FIG. 3, in the semiconductor integrated circuit 1 of the first embodiment, the scan chains 11 through 13 of the system logic circuit 2 and the scan chain 14 of the memory BIST circuit 4 can be written. Namely, in order to concurrently shift the test pattern into the scan chains 11 through 13 and write data into the RAM 3 from the scan chain 14 of the memory BIST circuit 4, the scan chain 14 in the memory BIST circuit 4 is made independent of the scan chains 11 through 13 of the other scan chains in the system logic circuit 2. Namely, the respective scan chains 11 through 13 have scan-in terminals SCAN IN1 to SCAN INn, and the scan chain 14 has a scan-in terminal mSCAN IN. The respective scan chains 11 through 13 have scan-out terminals SCAN OUT1 through SCAN OUTn, and the scan chain 14 has a scan-out terminal mSCAN OUT. Further, a scan enable SCAN_EN1 terminal and a scan enable SCAN_EN2 terminal are embodied in the form of directly-connectable external pins of the semiconductor integrated circuit 1, thereby facilitating mode switching of the scan chain 14 in the memory BIST circuit 4. Here, the mode of the scan chain 14 includes a mode for testing a failure in the memory BIST circuit 4, a mode for testing a failure in the RAM 3, and the like.

Method for testing the semiconductor integrated circuit of a first embodiment will now be described. The method for testing the semiconductor integrated circuit is performed by the semiconductor integrated circuit of the first embodiment.

Under the method for testing the semiconductor integrated circuit of the first embodiment, a logic test pattern has previously been generated in advance in the scan chains 11 through 13 in the system logic circuit 2 by the automatic test pattern generation ATPG tool. An ATPG tool having a sequential algorithm using a memory operation model does not need to be applied to the ATPG tool, but a combinational ATPG tool is applied. Therefore, in order to generate data, which are to be written into the RAM 3, in the BIST circuit 4, data have been set in advance as memory test pattern set data to be scanned by and shift in the scan chain 14 in the memory BIST circuit 4. A logic test pattern is generated by the ATPG tool on condition that the memory test pattern written into the RAM 3 is read without being rewritten.

Figure 5:
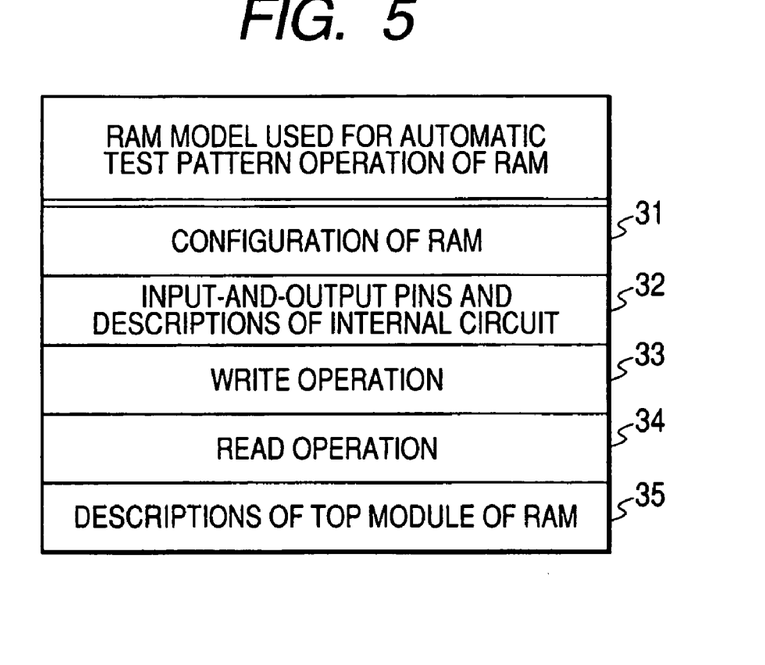
FIG. 5 is a configuration table of a RAM model for use with a RAM used at the time of automatic generation of a test pattern under a method for testing a semiconductor integrated circuit according to the embodiment.

The ATPG having a sequential algorithm using a memory operation model uses a RAM model such as that shown in FIG. 5. Under the method for testing a semiconductor integrated circuit of the first embodiment, the sequential ATPG executes a read-only memory (ROM) model such as that shown in FIG. 6. In the first embodiment, after the memory BIST circuit 4 has written desired data into the RAM 3, the RAM 3 is considered to be ROM during performance of the ATPG tool, and a test pattern using a ROM model is generated.

The RAM model shown in FIG. 5 has an area 31 pertaining to the configuration of RAM memory; an area 32 pertaining to descriptions of input-and-output pins and an internal circuit; an area 33 pertaining to writing Write operation; an area 34 pertaining to reading Read operation; and an area 35 pertaining to descriptions of a top module of RAM. In the area 31 pertaining the configuration of RAM memory, a memory size, such as the number of word and the number of bit, is declared. In the area 32 pertaining input-and-output pins and descriptions of the internal circuit, input-and-output pins and the internal circuit, which are required to perform a test, are set. In the area 33 pertaining to writing Write operation, a method for setting a writing mode, a method for specifying a memory cell into which data are to be written, a method for writing input data into the specified memory cell, and the like are set. In the area 34 pertaining to the reading Read operation, a method for setting a reading mode, a method for specifying a read memory cell, and a method for reading data from the specified memory cell, and the like, are set. In the area 35 pertaining to descriptions of the top module of RAM, a connection relationship between the input-and-output pins of RAM and another circuit to be connected to the RAM is set.

Figure 6:
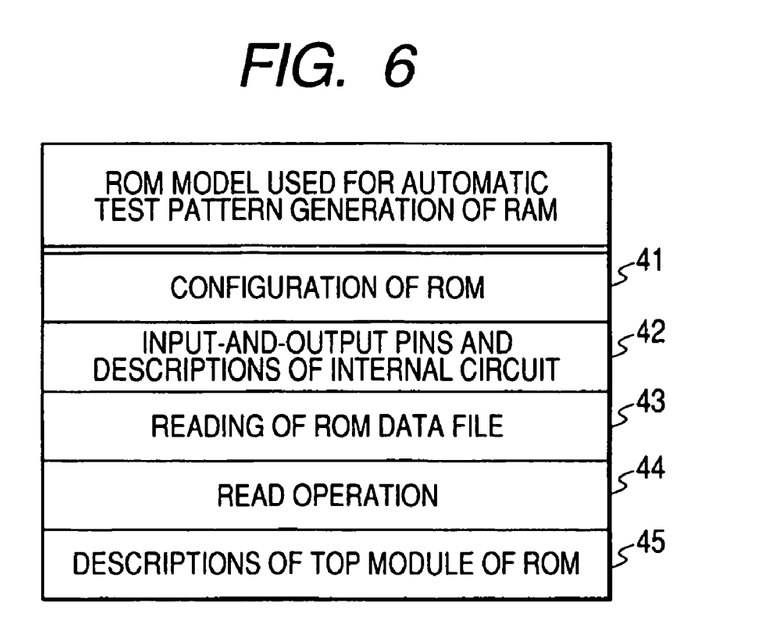
FIG. 6 is a configuration table of a ROM model for use with the RAM used at the time of automatic generation of a test pattern under the method for testing a semiconductor integrated circuit according to the embodiment.

The ROM model shown in FIG. 6 has an area 41 pertaining to the configuration of the RAM memory regarded as ROM; an area 42 pertaining to descriptions of input-and-output pins and an internal circuit; an area 43 pertaining to a data file to be written into the RAM regarded as ROM; an area 44 pertaining to reading Read operation; and an area 45 pertaining to descriptions of a top module of RAM. As in the case of the area 41 pertaining the configuration of RAM memory shown in FIG. 5, in the area 41 pertaining to the configuration of RAM memory regarded as ROM, a memory size, such as the number of word lines and the number of bit lines, is declared. As in the case of the area 32 which pertains to the input-and-output pins and descriptions of an internal circuit and is shown in FIG. 5, in the area 42 pertaining to input-and-output pins and descriptions of an internal circuit, input-and-output pins required for a test and an internal circuit are set. In the area 43 pertaining to a data file to be written into the RAM regarded as ROM, the data stored in ROM are set. As in the case of the area 34 pertaining to reading Read operation shown in FIG. 5, a method for setting a reading mode, a method for specifying a memory cell from which data are to be read, a method for reading data from the specified memory cell, and the like, are set. In the area 45 pertaining to descriptions of the top module of the RAM regarded as ROM, a connection relationship between the input-and-output pins of RAM and another circuit to be connected to the RAM is set, as in the case of the area 35 pertaining to descriptions of the top module of RAM shown in FIG. 5.

When the ROM model shown in FIG. 6 is compared with the RAM model shown in FIG. 5, only the reading operation 44 is described in the ROM model after description of the area 41 pertaining to a memory configuration and the area 42 pertaining to definitions of input-and-output pins. There are no descriptions of the writing operation 33. Previously-written data are stored in the other file 43. In the case of the RAM model, the ATPG tool generates a test pattern taking into consideration writing and reading operations. In contrast, the ROM model requires only reading operation, and hence generation of a test pattern performed by the ATPG tool is facilitated.

Figure 4:
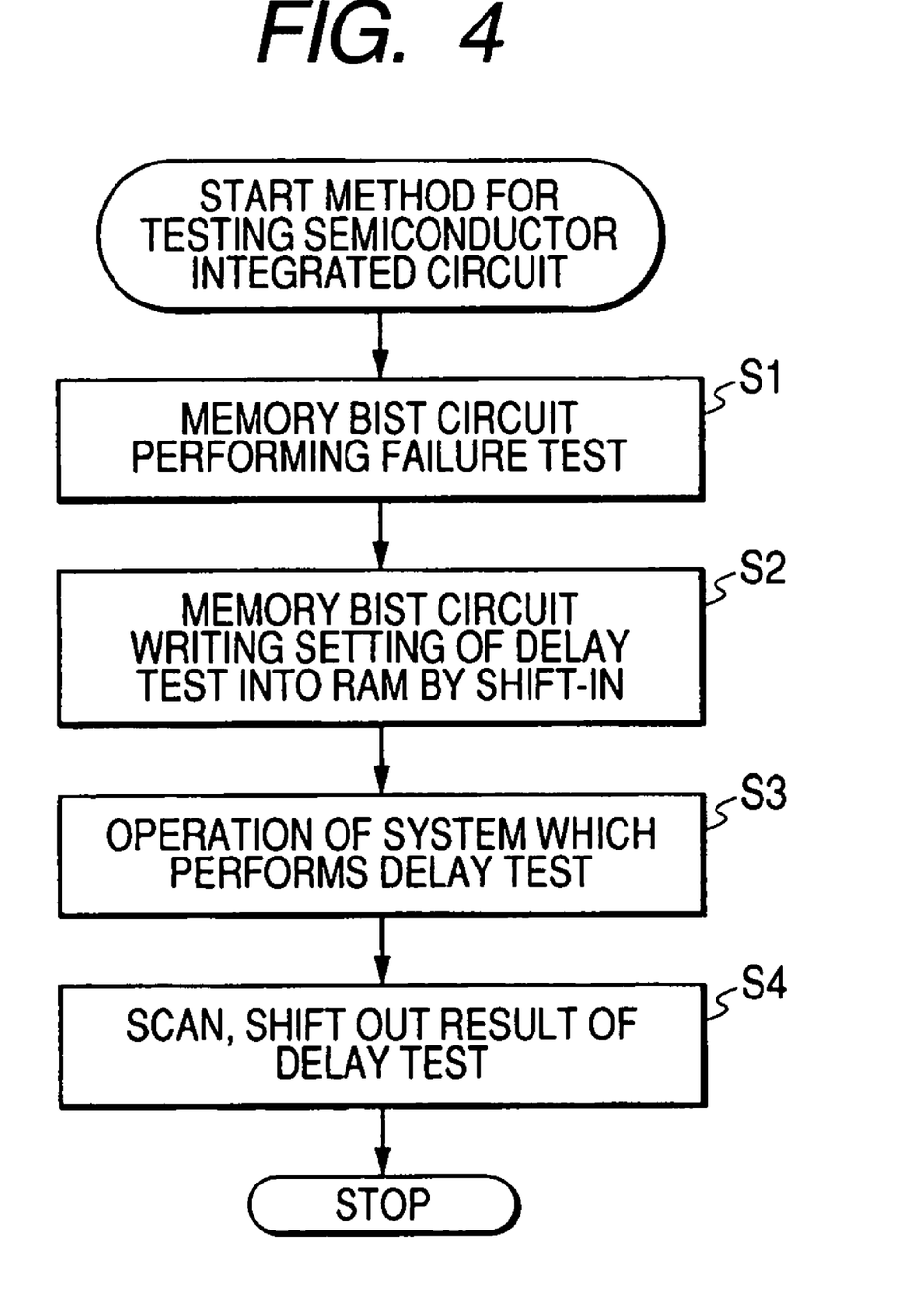
FIG. 4 is a flowchart showing a method for testing the semiconductor integrated circuit of the embodiment.

In step S1 shown in FIG. 4, the memory BIST circuit 4 performs a failure test for the RAM 3. The selector logic circuits 21, 22, and 23 select the memory BIST circuit. The memory BIST circuit 4 generates a test pattern d4, and the test pattern is input and written into the RAM 3. On the basis of a test d5 read from the RAM 3, the memory BIST circuit 4 determines whether or not the RAM 3 is broken. When the RAM 3 is determined to be broken, the operator determines that the semiconductor integrated circuit 1 including the broken RAM 3 is also broken, thereby stopping the method for stopping the semiconductor integrated circuit 1. When the RAM 3 is determined not to be broken and has passed the failure test, processing proceeds to step S2.

Figure 2:
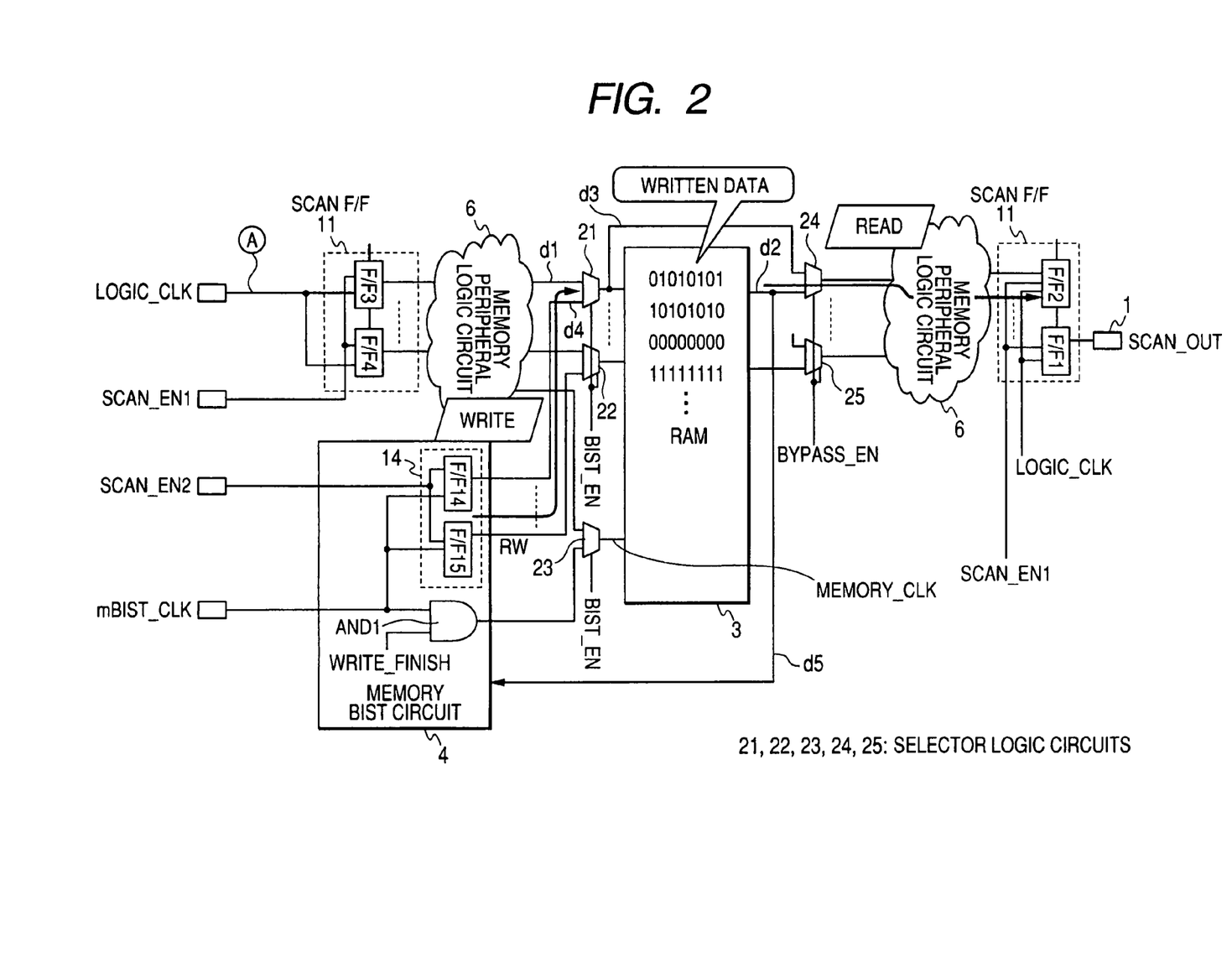
FIG. 2 is a block diagram (part 2) of a semiconductor integrated circuit according to the embodiment.

Prior to step S2, a test may be conducted at a frequency for a low test configuration where a signal bypasses the RAM 3 using the bypass path d3 shown in FIGS. 1 and 2. At the time of the test where the RAM 3 is bypassed, the selector logic circuits 24 and 25 select terminals connected to the path d3 for bypassing the RAM 3, in accordance with a signal bypass enable Bypass EN. By the test which bypasses the RAM 3, a stuck-at fault in the memory peripheral combinational logic circuit 6 or that in a peripheral circuit thereof can be detected.

Figure 7:
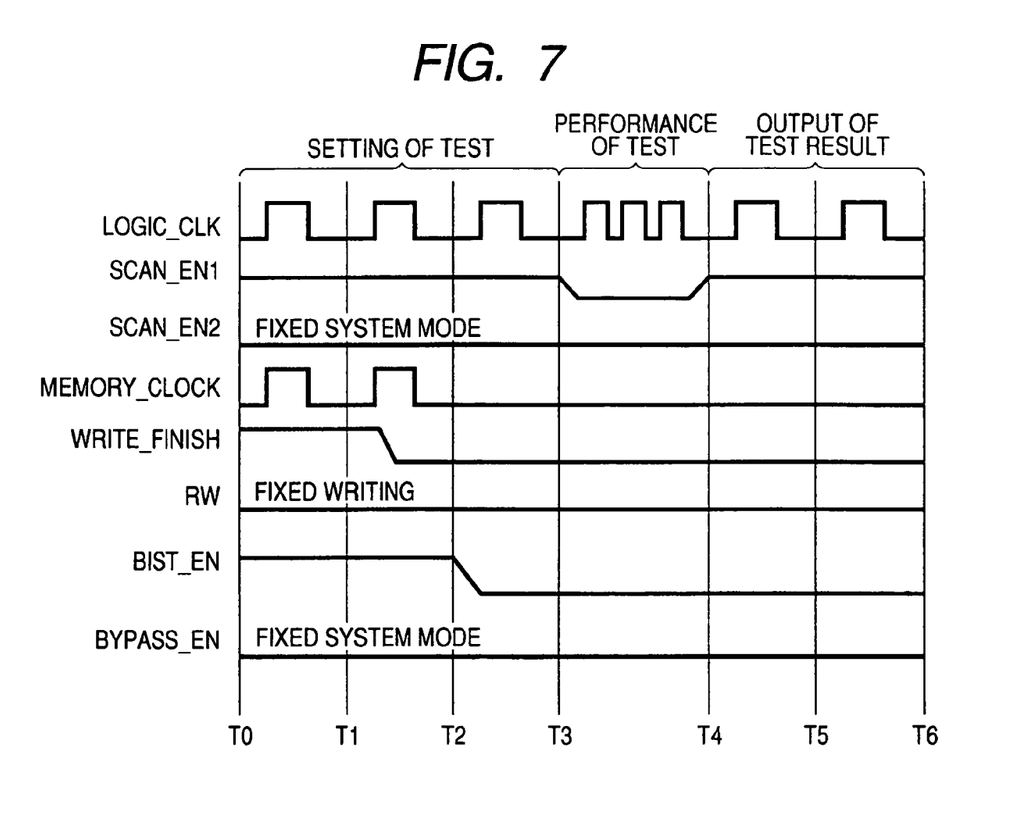
FIG. 7 is a timing chart for the method for testing a semiconductor integrated circuit according to the embodiment.

A delay test is set in step S2 shown in FIG. 4. In the delay test, an at-speed test is performed through the RAM 3 without bypassing the same. As shown in FIG. 7, at timing T0, the scan enable signal SCAN_EN1 is set to a high level 1 corresponding to a scan mode capable of effecting a scan-in event, and a single clock pulse is input from the logic CLK circuit, thereby shifting the logic test pattern into the scan chains 11 through 13. Simultaneously with or in parallel with this shift-in event, the scan enable signal SCAN_EN2 is set to a low level 0 corresponding to a system mode for enabling writing of the scan chain 14 in the memory BIST circuit 4, and a single clock pulse of the mBIST_CLK signal is input to thereby write a memory test pattern, which is to become desired data, into memory cells of all of the addresses in the RAM 3 from the memory BIST circuit 4. At timing T1, operation for writing the memory test pattern into all of the address of the RAM 3 of the memory BIST circuit 4 is completed, where upon there arises a logic change from the high level 1 of a write finish signal Write_Finish to a low level 0 of the same. By this logic change, the memory BIST clock signal mBIST_CLK is not transmitted to the memory CLK of the RAM 3, and the memory CLK signal is fixed to low level 0. The memory test pattern written into the RAM 3 is stored and retained in all of the addresses. At timing T2 next to timing T1 at which operation for writing the memory test pattern into the RAM 3 has finished, the BIST enable signal BIST EN is switched from high level 1 to low level 0. The selector logic circuits 21, 22, and 23 switch the selection of a connection to the memory BIST circuit 4 to the selection of a connection to the memory peripheral combinational logic circuit 6.

In step S3 shown in FIG. 4, the delay test is conducted. When operation for shifting the logic test pattern into the scan chains 11 through 13 has finished at timing T3, the scan enable signal SCAN_EN1 goes to low level 0 where the shift-in event is stopped. By this logic change, the delay test is started. Three clock pulses are input to the logic CLK circuit. The logic test pattern is output from the scan chains 11 through 13 to the combinational logic circuits 6 through 9 by the first clock pulse of these three clock pulses. The logic test pattern is input into the RAM 3 as a read command signal for the RAM 3 through the combinational logic circuit 6 and the selector logic circuits 21 and 22.

By the second clock pulse, the RAM 3 outputs corresponding data in the memory test pattern stored in the RAM 3 as a read data signal, in accordance with the input read command signal. Thus, data are not written into the RAM 3 by the second clock pulse, and the RAM 3 only reads data. Therefore, the semiconductor integrated circuit can be considered to function as ROM. By the third clock pulse, the read data signal travels to the selector logic circuits 24, 25 and the combinational logic circuit 6. The test result, which is attributed to the read data signal and has passed through the selector logic circuits 24, 25 and the combinational logic circuit 6, is taken into and stored in the scan chain 11. Thus, performance of the delay test is completed, and the scan enable signal SCAN_EN1 goes, at timing T4 next to the timing of the third clock pulse, to high level 1 at which a shift-out event is possible. By this logic change, processing pertaining to step S5 shown in FIG. 4 is started.

In step S4, a single clock pulse is input from the logic CLK into the scan chains 11 through 13, and the test result stored in the scan chains 11 through 13 is scanned and shifted out. The logic CLK signal is input to the scan chains 11 through 13 until all the test results are scanned and shifted out. The shifted-out test results are output to an external tester of the semiconductor integrated circuit 1. The tester determines whether the test results have passed or failed and, further, whether the semiconductor integrated circuit has passed or failed. Thus, the method for testing the semiconductor integrated circuit is completed.

As mentioned above, in the first embodiment, data are written into the RAM 3 by use of the memory BIST circuit 4 rather than by scan and shift-in operations, whereby desired data can be readily written into all of the addresses. Further, during performance of the ATPG tool, the RAM is considered to be ROM, and the logic test pattern is generated. Accordingly, generation of the logic test pattern is facilitated. From these facts, the at-speed test of the memory peripheral logic circuit 6 of the system logic circuit 2 around the RAM 3 can be carried out. In the first embodiment, the memory BIST circuit 4, which is originally prepared for testing the inside of the RAM 3, is utilized, to thus write data into the RAM 3 and control the signals. As a result, the rate of detection of a delay failure test of the memory peripheral logic circuit 6 can be enhanced. Further, the time required to generate a test pattern and the number of generation test patterns can also be diminished.

There will now be described, as a modification of the first embodiment, a case where shift-in of the logic test pattern has been completed first by writing of a memory test pattern during writing of the memory test pattern into the RAM 3 in parallel with shift-in of the logic test pattern into the scan chains 11 through 13.

Figure 8:
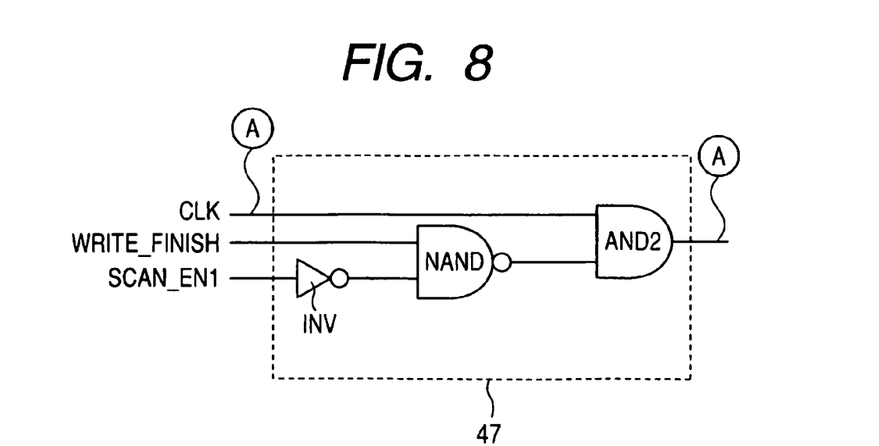
FIG. 8 is a block diagram of a clock control circuit provided in the semiconductor integrated circuit according to the embodiment.

A semiconductor integrated circuit according to the modification of the first embodiment is a semiconductor integrated circuit formed by inserting a clock control circuit 47 such as that shown in FIG. 8 to a point A of the semiconductor integrated circuit shown in FIG. 2 such that the point A in FIG. 2 coincides with the point A in FIG. 8. The clock control circuit 47 has an inverter INV, a NOT-AND circuit NAND, and an AND circuit AND 2. The scan enable signal SCAN EN1 is input to an input terminal of the inverter INV. An output terminal of the inverter INV is connected to one input terminal of the NOT-AND circuit NAND. A write finish signal Write Finish is input to the other input terminal of the NOT-AND circuit NAND. An output terminal of the NOT-AND logic circuit NAND is connected to one input terminal of the AND circuit AND 2. The logic CLK signal is input to the other input terminal of the AND circuit AND 2. An output terminal of the AND circuit AND 2 is connected to the scan clock terminals of the respective flip-flops F/F1 to F/F13 of the scan chains 11 through 13.

Figure 9:
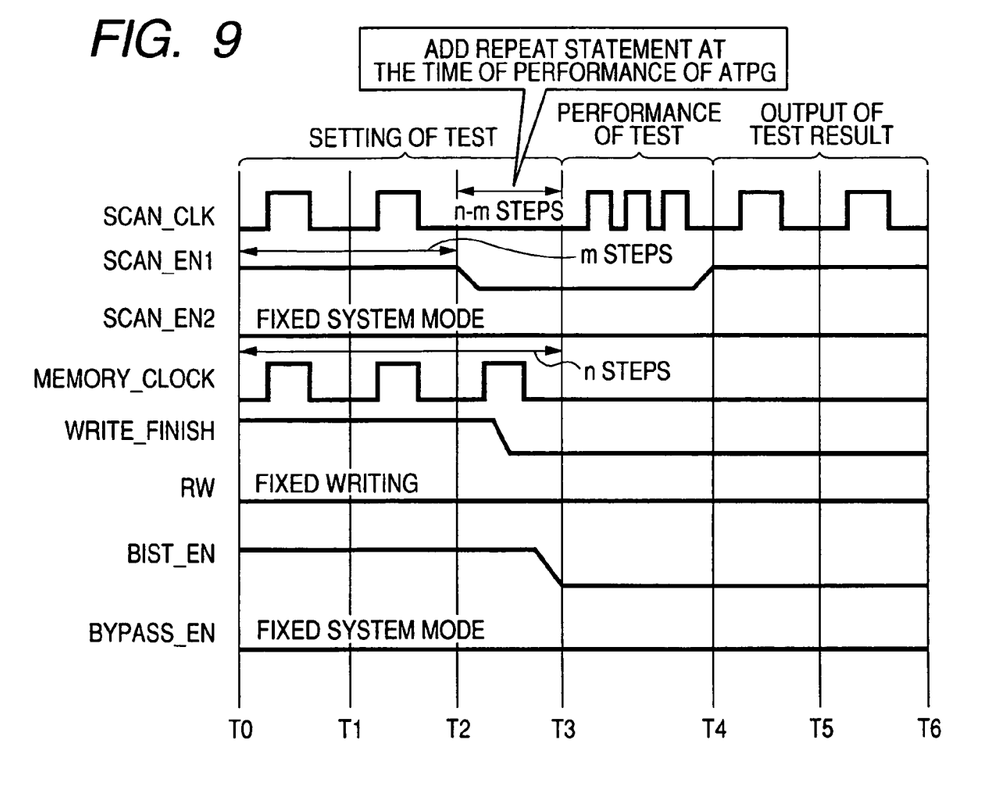
FIG. 9 is a timing chart for a case where the number of steps required to write data into memory BIST is larger than the number of steps required to effect scan shift-in operation under the method for testing the semiconductor integrated circuit according to the embodiment.

As shown in FIG. 9, in the semiconductor integrated circuit of the modification of the first embodiment having the clock control circuit 47, the scan clock SCAN CLK signal which is received by the scan chains 11 through 13 can be stopped from the end of the shift-in event to the completion of writing of the memory test pattern. Specifically, the SCAN CLK signal is stopped during a period from timing T2 to timing T3.

Figure 10:
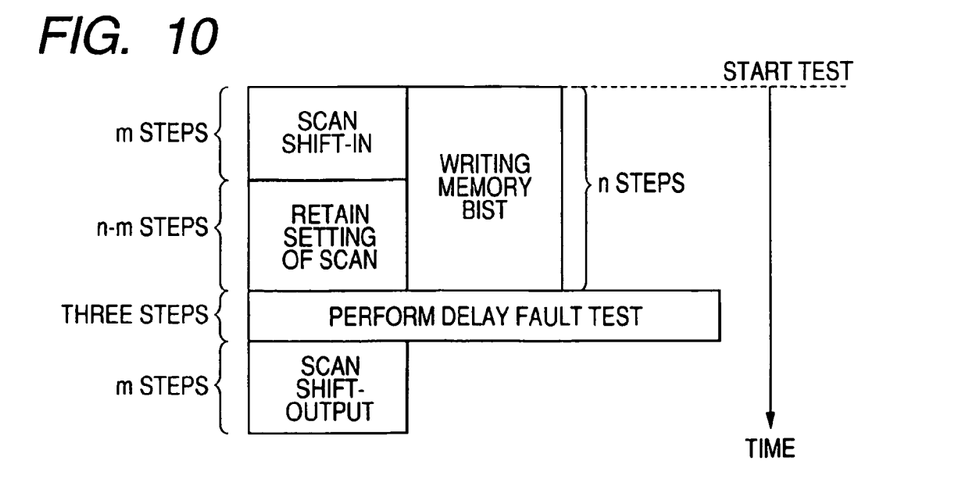
FIG. 10 is a test pattern chart used for retaining specifics of scan settings when the number of steps required to write data into memory BIST is larger than the number of steps required to effect scan shift-in operation under the method for testing the semiconductor integrated circuit according to the embodiment.

As shown in FIG. 10, scan shift-in operation is assumed to require the scan clock signal SCAN CLK which is equal in amount to "m" steps. Further, writing operation performed by the memory BIST circuit 4 is assumed to require memory BIST clock signal mBIST CLK which is equal in amount to "n" steps. Further, "n" steps is assumed to be greater in number to "m" steps. At the initiation of a delay test, scan shift-in operation and writing operation of the memory BIST circuit 4 are performed in parallel with each other. Even when scan shift-in of the logic test pattern prepared by the ATPG tool has been completed, the memory BIST circuit 4 continuously writes data into the RAM 3 during the period of (n-m) step until switching to the system mode is made. In the interim, scan actions of the scan chains 11 through 13 are suspended, and the shift-in logic test pattern must be retained. As a result, even when the number of steps for writing data into the memory BIST circuit 4 is greater than the number of shift-in steps, a scan shift-in logic state is retained, so that a delayed failure test of the memory peripheral logic circuit can be performed. When the "n" step is greater in number than the "m" step, the clock control circuit 47 is required. When the "n" step is smaller in number than the "m" step, the clock control circuit 47 becomes unnecessary. Presence/absence of the clock control circuit 47 must be determined at the time of designing of a semiconductor integrated circuit on the basis of a magnitude relationship between the "n" step and the "m" step.

Figure 11:
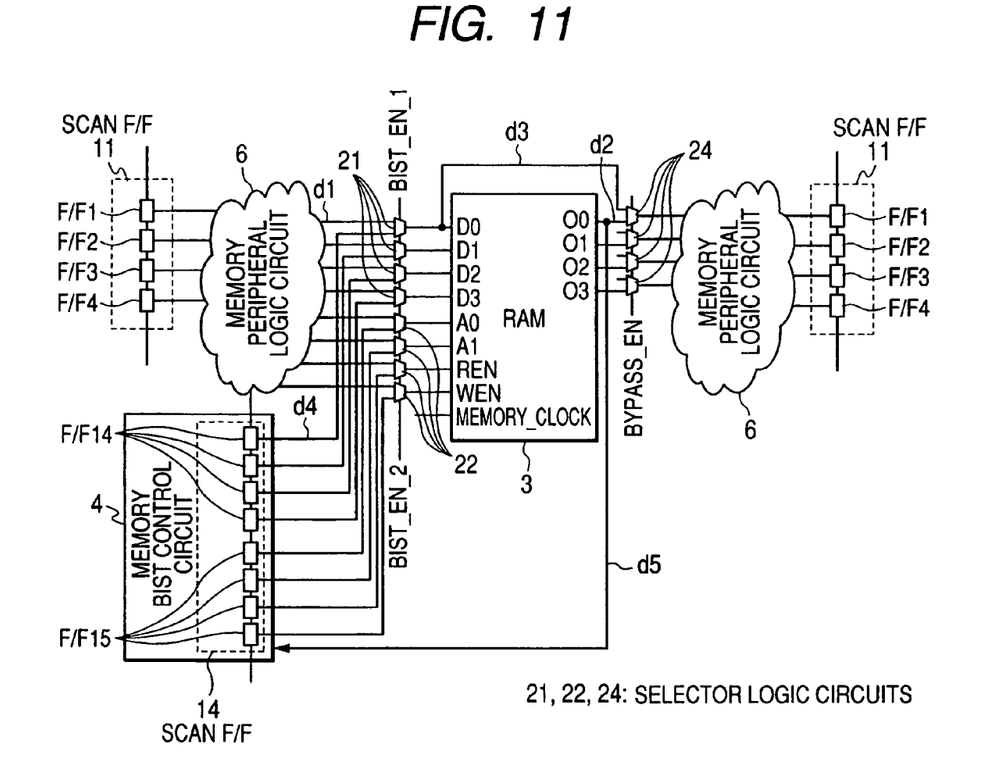
FIG. 11 is a block diagram of the semiconductor integrated circuit according to an embodiment.

As shown in FIG. 11, the semiconductor integrated circuit 1 of the first embodiment shown in FIG. 2 is different from the semiconductor integrated circuit of the second embodiment in that the selector logic circuits 21 and 22 select one from the combinational logic circuit and the memory BIST circuit not by the single BIST enable signal BIST EN but the plurality of BIST enable signals BIST EN1 and BIST EN2. Specifically, the RAM 3 has data input pins D0, D1, D2, and D3. The RAM 3 has two address pins A0, A1; a read enable pin REN; a write enable pin WEN (all of which are herein after collectively called "control input pins"). The RAM 3 has data output pins O0, O1, O2, and O3. The data input pins D0, D0, D2, and D3 are connected to respective output terminals of the plurality of selector logic circuits 21 which switch between inputs from the peripheral logic circuit 6 and inputs from the memory BIST control circuit 4 when the system is in operation. Switching operations of these selector logic circuits 21 are controlled by a common BIST enable signal BIST_EN1. The control input pins A0, A1, REN, and WEN are connected to respective output terminals of the plurality of selector logic circuits 22 which switch between inputs from the peripheral logic circuit 6 and inputs from the memory BIST control circuit 4 when the system is in operation. Switching operations of the selector logic circuits 22 are controlled by a common BIST enable signal BIST_EN_2.

When the BIST enable signal BIST_EN_1 is at a low level (BIST_EN_1=0), the data, which have been output from the scan chain 11 in the system logic circuit, are input to the data input pins D0, D1, D2, and D3 through the memory peripheral logic circuit 6 and the selector logic circuits 21. In contrast, when the BIST enable signal BIST_EN_1 is at a high level (BIST_EN_1=1), the data, which have been output from the scan chain 14 in the memory BIST circuit 4, are input directly to the data input pins D0, D1, D2, and D3 while passing through the selector logic circuits 21.

Likewise, When the BIST enable signal BIST_EN_1 is at a low level (BIST_EN2=0), the data, which have been output from the scan chain 11 in the system logic circuit, are input to the data input pins D0, D1, D2, and D3 through the memory peripheral logic circuit 6 and the selector logic circuits 21. In the meantime, when the BIST enable signal BIST_EN_2 is at a high level (BIST_EN_2=1), the control data, which have been output from the scan chain 14 in the memory BIST circuit 4, are input directly to the control input pins A0, A1, REN, and WEN through the selector logic circuits 22.

Figure 12:
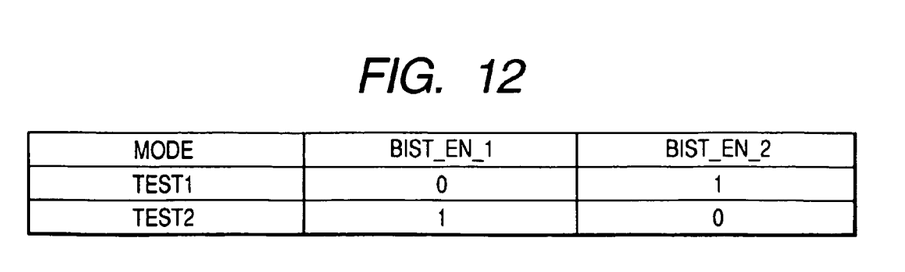
FIG. 12 is a table showing a relationship between two test modes and a selector control signal of the semiconductor integrated circuit according to the embodiment.
Figure 13:
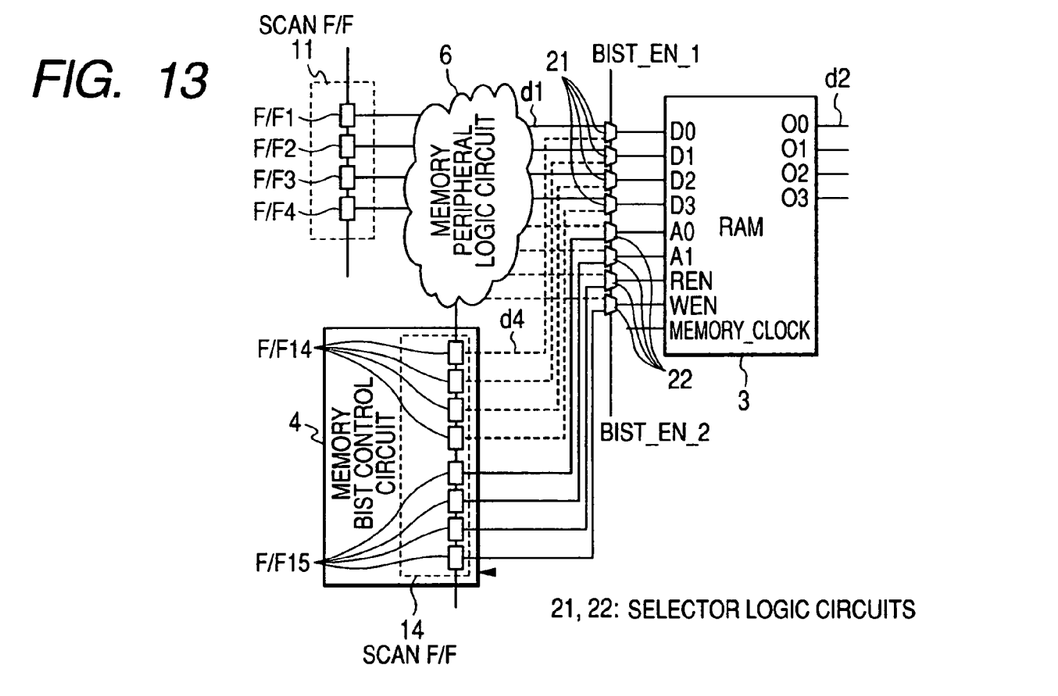
FIG. 13 is a drawing of a connection status employed in a TEST1 mode of the semiconductor integrated circuit according to the embodiment.
Figure 14:
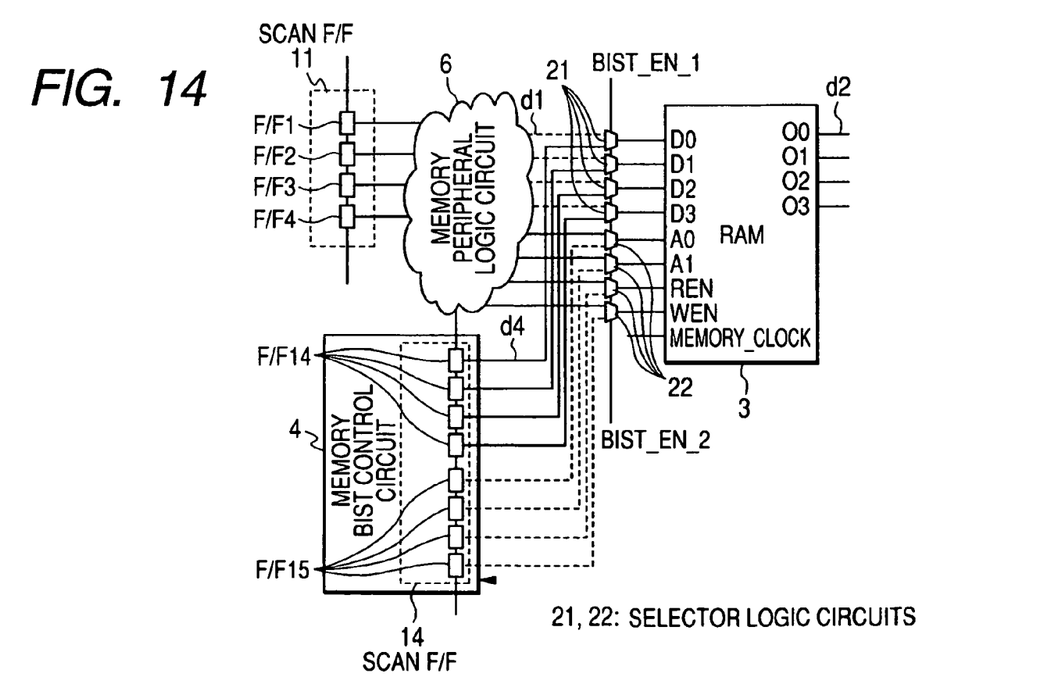
FIG. 14 is a drawing of a connection status employed in a TEST2 mode of the semiconductor integrated circuit according to the embodiment.

As shown in FIG. 12, under the method for testing the semiconductor integrated circuit of the second embodiment, two test modes TEST1 and TEST" are set in connection with a plurality of examples shown in FIG. 12. The two test modes TEST1 and TEST2 correspond to values of the selector selection signals BIST_EN_1 and BIST_EN_2 in the respective modes. In the test mode TEST1, BIST_EN_1=0 and BIST_EN_2=1 are obtained. Accordingly, as shown in FIG. 13, the memory peripheral combinational logic circuit 6 is connected to the data pins D0, D1, D2, and D3 of the RAM 3. Further, since there is BIST_EN_2=1, the memory BIST circuit 4 is connected to the control input pins A0, A1, REN, and WEN of the RAM 3. In the test mode TEST2 shown in FIG. 2, there are obtained BIST_EN_1=1and BIST_EN_2=0. Hence, as shown in FIG. 14, the memory BIST circuit 4 is connected to the input pins D0, D1, D2, and D3 of the RAM 3. Since there is obtained BIST_EN_2=0, the control input pins A0, A1, REN, and WEN of the RAM 3 are connected to the memory peripheral combinational logic circuit 6.

Figure 15:
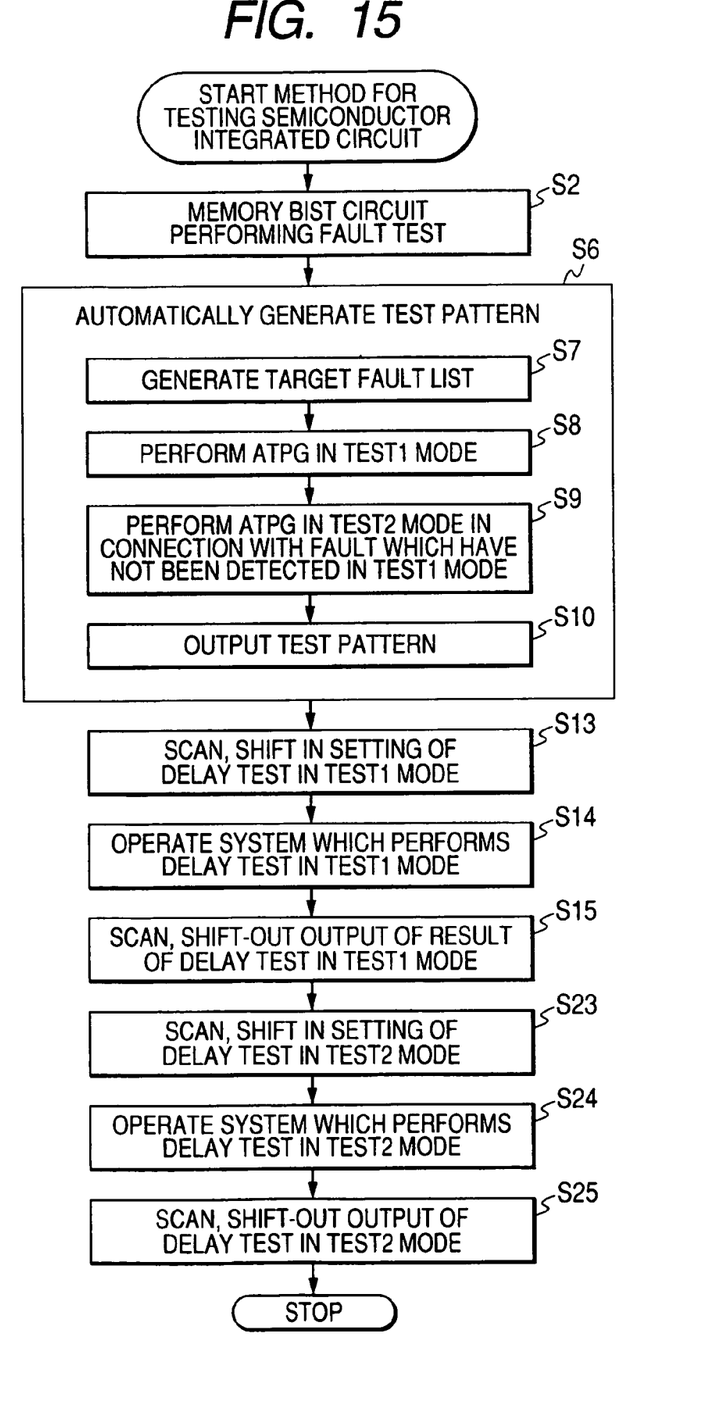
FIG. 15 is a flowchart of the method for testing the semiconductor integrated circuit according to the embodiment.

The method for testing a semiconductor integrated circuit of the second embodiment will now be described. As shown in FIG. 15, the failure test of the memory BIST circuit is carried out in step S2, as in the case of step S2 of the first embodiment shown in FIG. 4.

In step S6, the automatic test pattern generation ATPG tool is operated. Step 6 comprises steps S7 through S10. In step S7, a target fault list, which is a list of locations of targets having a potential risk of occurrence of a failure, is generated.

In step S8, the ATPG tool is operated in the test mode TEST1. The control input pins A0, A1, REN, and WEN of the RAM 3 are merely used for setting a desired value into the scan chain 14 in the memory BIST circuit 4. Therefore, the algorithm of the ATPG tool does not require complicated processing. Specifically, the control input pins A0, A1, REN, WEN and the memory test pattern can be said to exhibit high controllability. In order to set appropriate values to the data input pins D0, D1, D2, and D3 and appropriate values to the data output pins O0, O1, O2, and O3, an ATPG—having a sequential algorithm which uses the RAM model shown in FIG. 5 as a memory operation model—is used. Since the logic test pattern must be determined in consideration of the RAM 3 as well as the memory peripheral logic circuit 6, the algorithm of the ATPG tool requires complicated processing. However, the settings of the control input pins A0, A1, REN, and WEN can be readily changed according to the object of the test of the logic test pattern. Hence, the degree of complication of complicate processing can be considerably lessened. The logic test pattern can be said to exhibit high controllability. From these facts, despite of the ATPG tool having the sequential algorithm using the RAM model, the load of the ATPG tool, which is imposed by test pattern generation processing, is very diminished. Therefore, the efficiency of generation of the logic test pattern, which is output to the data input pins D0, D1, D2, and D3 and used for testing the memory peripheral logic circuit 6, can be extremely enhanced.

In step S9, ATPG is carried out in the test mode TEST2 in connection with the target fault list which has not been detected in the test mode TEST1. There is generated a logic test pattern used for testing the memory peripheral logic circuit 6, which are relevant to and connected to the control input pins A0, A1, REN, and WEN. At this time, the test pattern does not need to be again generated in connection with the target fault list that can be detected by the logic test pattern generated in the test mode TEST1. Accordingly, a logic test pattern is generated in connection with the target fault list which has not been detected in the test mode TEST1.

In step S10, the logic test pattern and the memory test pattern for the test modes TEST1 and TEST2 are output. Thus, processing pertaining to step 6 is completed.

In step S13, the semiconductor integrated circuit to be tested is set to the test mode TEST1. Further, as settings of the delay test, the logic test pattern for the test mode TEST1 is shifted in the scan chain 11. The memory test pattern for the test mode 1 is also shifted in by the memory BIST circuit 4.

In step S14, as in the case of processing pertaining to step S4 in FIG. 4 of the first embodiment, a delay test is performed while the semiconductor integrated circuit to be tested remains in the test mode TEST1.

In step S15, as in the case of processing pertaining to step S5 in FIG. 4 of the first embodiment, the test result of the delay test is output while the semiconductor integrated circuit to be tested remains in the test mode TEST1.

In step S23, the semiconductor integrated circuit to be tested is set to the test mode TEST2. Further, as settings of the delay test, the logic test pattern for the test mode TEST2 is shifted in the scan chain 11. The memory test pattern for the test mode 2 is also shifted in by the memory BIST circuit 4.

In step S24, as in the case of processing pertaining to step S4 in FIG. 4 of the first embodiment, a delay test is performed while the semiconductor integrated circuit to be tested remains in the test mode TEST2.

In step S25, as in the case of processing pertaining to step S5 in FIG. 4 of the first embodiment, the test result of the delay test is output while the semiconductor integrated circuit to be tested remains in the test mode TEST2. Thus, the method for testing the semiconductor integrated circuit of the second embodiment is completed.

According to the second embodiment, a portion of the memory input which is less controllable from the outside is connected to the inside of the highly-controllable memory BIST circuit 4, whereby generation of the logic test pattern, which is formed by writing desired data into the RAM 3 from the system logic circuit 6, is facilitated, thereby enhancing a fault coverage. The input connected to the inside of the memory BIST circuit 4 is changed by the test modes TEST1, TEST2, where by all necessary logic patterns can be generated from the target failure list. According to the second embodiment, when the logic test pattern of the memory peripheral logic circuit 6 is generated, portions of the data in the RAM 3 are set by the memory BIST circuit 4. Hence, generation of the logic test pattern is facilitated, and shortening of the time required to generate a test pattern and a reduction in the number of generated test patterns are possible.

Figure 16:
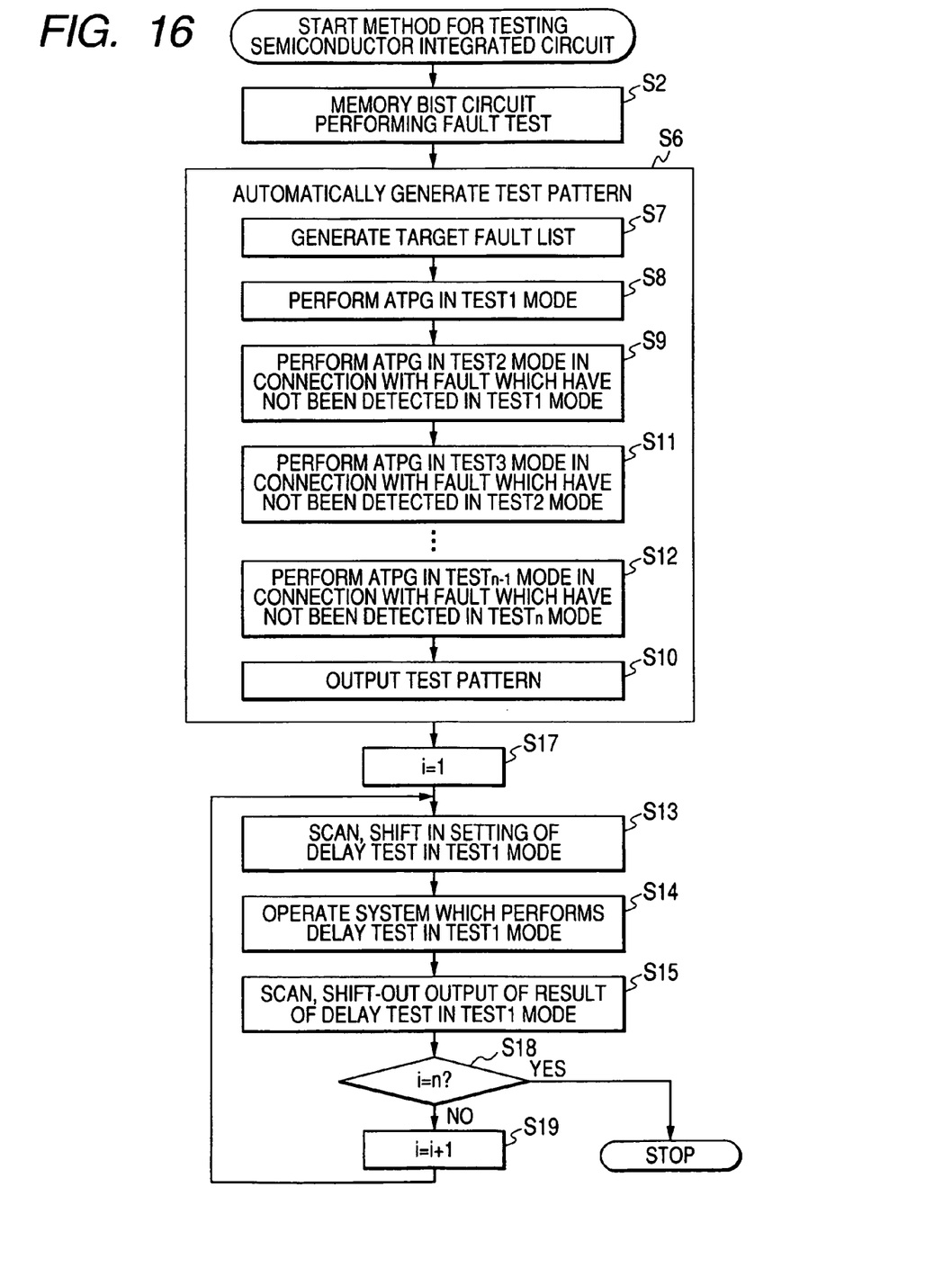
FIG. 16 is a flowchart of the method for testing the semiconductor integrated circuit according to the embodiment.
Figure 17:
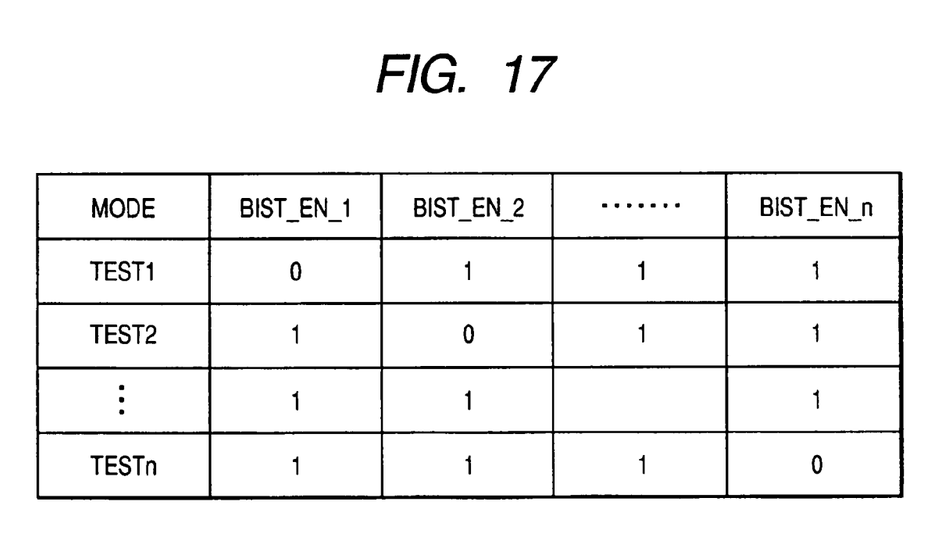
FIG. 17 is a table showing a relationship between "n" test modes and selector control signals in the semiconductor integrated circuit according to the embodiment.

The test mode is not limited to two: namely, TEST1 and TEST2. The plurality of selector logic circuits 21, 22, which switch between the memory peripheral logic circuit 6 of the system logic circuit 1 and the memory BIST circuit 4, at the input side of the RAM 3, may be divided into "n" groups (n>2). When the plurality of selector logic circuits have been divided into "n" groups, "n" BIST enable signals BIST_EN_1 through BIST_EN_n are set for each group. Test modes TEST1 through TESTn are set. By them, only the BIST enable signals BIST_EN_1 through BIST_EN_n of one or the plurality of groups of selector logic circuits 21, 22 among a total "n" groups are switched to the memory peripheral logic circuit 6. The BIST enable signals BIST_EN_1 through BIST_EN_n of the remaining groups of the selector logic circuits 21, 22 are switched to the memory BIST circuit 4. FIG. 17 shows example settings of test modes, wherein a group is selected, one at a time, from the "n" groups for the memory peripheral logic circuit 6 (BIST_EN_1 to n=0), to thus generate "n" test modes TEST1 through TESTn. A method for testing a semiconductor integrated circuit, which tests all the target fault lists by use of such "n" test modes TEST1 through TESTn, is shown as a flowchart in FIG. 16. As in the case of the two test modes shown in FIG. 15, ATPG and the delay test are carried out for each test mode. Thereby, tests of all of the target fault lists can be performed. In the embodiment shown in FIG. 17, only one BIST_EN signal is used for effecting operation for selecting 0; namely, the memory peripheral logic circuit 6, is performed in one test mode. Conversely, all the remaining BIST_EN signals are used for effecting operation for selecting 1; namely, the memory BIST circuit 4. Pieces of data in the RAM 3, which are larger in number than those employed in the second embodiment, can be set by the memory BIST circuit 4. Thus, generation of a logic test pattern is facilitated to a greater extent. Shortening of the time required to generate a test pattern and the number of generated test patterns are further promoted.

The first and second embodiments are mere illustrations of specific examples at the time of implementation of the present invention. The technical scope of the present invention cannot be limitedly construed by the first and second embodiments. The present invention can be carried out in various forms without departing from the technical scope and principal features of the present invention. Specifically, the present invention can be altered, improved, and partially diverted without departing the scope of claims of the present invention, and all these alterations, improvements, and diversions should fall within the scope of claims of the present invention.

According to the embodiments, there can be provided a semiconductor integrated circuit capable of performing an at-speed test of a system logic circuit around RAM. There can also be provided a method for testing a semiconductor integrated circuit capable of performing an at-speed test of a system logic circuit around RAM.

What is claimed is:

1. A semiconductor integrated circuit comprising:
   a random access memory;
   a memory BIST circuit that writes a memory test pattern into the random access memory after the random access memory passes a failure test;
   a scan chain which effects shift-in of a logic test pattern generated by automatic pattern generation on condition that the memory test pattern is read without being rewritten; and
   a combinational logic circuit that can configure a system logic circuit along with the scan chain, wherein
   the random access memory outputs a data signal read from the memory test pattern, by a read command signal that is attributable to the logic test pattern and is passed the combinational logic circuit,
   a test result that is attributed to the-read data signal and is passed through the combinational logic circuit is input to the scan chain, and
   the scan chain shifts out the test result.

2. The semiconductor integrated circuit according to claim 1, further comprising:
   a clock control circuit that, when the shift-in ends faster than writing of the memory test pattern at the time of the memory test pattern being written along with the shift-in event, stops a scan clock signal to be received by the scan chain from completion of the shift-in event until completion of writing of the memory test pattern.

3. A method for testing a semiconductor integrated circuit, comprising:
   generating a logic test pattern by automatic pattern generation on condition that a memory test pattern written in random access memory is read without being read;
   performing a failure test of the random access memory by a memory BIST circuit;
   performing the memory test pattern into the random access memory after the random access memory is passed the failure test;
   performing a shift-in the logic test pattern by a scan chain that can configure a system logic circuit along with a combinational logic circuit;
   outputting a read data signal read from the memory test pattern in accordance with a read command signal that is attributed to the logic test pattern and is passed through the combinational logic circuit;
   inputting a test result, which is attributed to the read data signal and is passed through the combinational logic circuit, into the scan chain; and
   shifting out the test result by the scan chain.

4. The method for testing a semiconductor integrated circuit according to claim 3, wherein, when the shift-in event ends faster than writing of the memory test pattern at the time of the memory test pattern being written along with the shift-in event, a scan clock signal to be received by the scan chain is stopped from completion of the shift-in event until completion of writing of the memory test pattern.

5. A method for testing a semiconductor integrated circuit, comprising:
   performing a failure test of the random access memory by a memory BIST circuit that is connected to a plurality of input terminals of random access memory;
   generating a logic test pattern by automatic pattern generation on condition that some of the input terminals are connected to the memory BIST circuit and that the other input terminals are connected to a system logic circuit;
   writing a test pattern into the random access memory by use of a scan chain in the memory BIST circuit after the random access memory has passed the failure test;
   shifting in the logic test pattern by a scan chain that can configure a system logic circuit along with a combinational logic circuit;
   outputting a read data signal read from the memory test pattern, in accordance with a read command signal which is attributed to the logic test pattern and is read through the combinational logic circuit;
   inputting a test result, that is attributed to the read data signal and is passed through the combinational logic circuit, into the scan chain; and
   shifting in the test result by the scan chain.

* * * * *